(12) United States Patent
Yoshitomi et al.

(10) Patent No.: US 11,577,269 B2
(45) Date of Patent: Feb. 14, 2023

(54) WORKPIECE PROCESSING APPARATUS USING WORKPIECE HAVING REFERENCE MARKS, WORKPIECE PROCESSING METHOD, AND COMPUTER STORAGE MEDIUM

(71) Applicant: Tokyo Electron Limited, Tokyo (JP)

(72) Inventors: Wataru Yoshitomi, Kumamoto (JP); Koutarou Onoue, Kumamoto (JP); Yasushi Kuranaga, Kumamoto (JP); Kazuki Tashima, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 94 days.

(21) Appl. No.: 15/904,553

(22) Filed: Feb. 26, 2018

(65) Prior Publication Data

US 2018/0257100 A1 Sep. 13, 2018

(30) Foreign Application Priority Data

Mar. 7, 2017 (JP) .............................. JP2017-042750

(51) Int. Cl.
*B05D 1/26* (2006.01)
*B05B 12/08* (2006.01)
(Continued)

(52) U.S. Cl.
CPC ............ *B05C 11/00* (2013.01); *B05B 12/084* (2013.01); *B05B 12/124* (2013.01); *B05C 11/1021* (2013.01); *B05D 1/26* (2013.01); *B41J 11/46* (2013.01); *B41J 25/001* (2013.01); *H01L 23/544* (2013.01); *H05B 33/10* (2013.01); *B05C 5/02* (2013.01); *B05C 11/1005* (2013.01);
(Continued)

(58) Field of Classification Search
CPC ...................... B05C 11/1021; H01L 51/0005
See application file for complete search history.

(56) References Cited

U.S. PATENT DOCUMENTS 10,414,162 B2 * 9/2019 Elgee ................... B41J 2/04561
2002/0135632 A1 * 9/2002 Tsuruoka ........... G01N 33/6803
347/19
(Continued)

FOREIGN PATENT DOCUMENTS

CN 101185035 A 5/2008
JP 2009095725 A * 5/2009 ............... G02B 5/20
(Continued)

*Primary Examiner* — Karl Kurple
(74) *Attorney, Agent, or Firm* — Venjuris, P.C.

(57) ABSTRACT

Disclosed is a workpiece processing apparatus that performs a predetermined processing on a workpiece. The workpiece processing apparatus includes: a workpiece table configured to place the workpiece thereon; a processor configured to process the workpiece placed on the workpiece table; a movement mechanism configured to relatively move the workpiece table and the processor; a position measuring device configured to measure a position of the movement mechanism; a detector configured to detect a position of the workpiece placed on the workpiece table; and a corrector
(Continued)

configured to calculate a positional correction amount of the workpiece table based on a measurement result of the position measuring device and a detection result of the detector.

5 Claims, 8 Drawing Sheets

(51) Int. Cl.
  *B05B 12/12* (2006.01)
  *B41J 11/42* (2006.01)
  *H01L 23/544* (2006.01)
  *B05C 11/00* (2006.01)
  *B05C 11/10* (2006.01)
  *B41J 11/46* (2006.01)
  *H05B 33/10* (2006.01)
  *B41J 25/00* (2006.01)
  *G03F 9/00* (2006.01)
  *B05C 5/02* (2006.01)
  *G01B 11/00* (2006.01)
  *G01B 11/14* (2006.01)
  *B05C 13/00* (2006.01)
  *H01L 51/00* (2006.01)
  *B41J 29/393* (2006.01)
  *B41J 2/045* (2006.01)

(52) U.S. Cl.
  CPC ........... *B05C 11/1015* (2013.01); *B05C 13/00* (2013.01); *B41J 2/04505* (2013.01); *B41J 11/42* (2013.01); *B41J 29/393* (2013.01); *B41J 2029/3935* (2013.01); *B41J 2202/09* (2013.01); *B41J 2203/01* (2020.08); *G01B 11/002* (2013.01); *G01B 11/14* (2013.01); *G03F 9/7084* (2013.01); *H01L 51/0005* (2013.01)

(56) References Cited

U.S. PATENT DOCUMENTS

| | | | | |
|---|---|---|---|---|
| 2003/0063154 A1* | 4/2003 | Goto | ........................ | B41J 2/145 347/40 |
| 2003/0234827 A1* | 12/2003 | Tsuruoka | ............... | B41J 19/202 347/14 |
| 2005/0089762 A1* | 4/2005 | Consolini | ............. | G03F 9/7084 430/5 |
| 2007/0070099 A1* | 3/2007 | Beer | ...................... | B41J 2/0456 347/8 |
| 2007/0070107 A1* | 3/2007 | Shamoun | ............... | B41J 29/393 347/14 |
| 2007/0159632 A1* | 7/2007 | Shibazaki | ........... | G03F 7/70733 356/401 |
| 2008/0029715 A1* | 2/2008 | Morikazu | ............ | B23K 26/044 250/491.1 |
| 2011/0182161 A1* | 7/2011 | Suzuki | ................... | B82Y 10/00 369/47.13 |
| 2012/0181445 A1* | 7/2012 | Kitahara | ............ | G11B 7/0953 250/453.11 |
| 2014/0278188 A1* | 9/2014 | Yuditsky | ............ | G01N 21/9501 702/151 |
| 2017/0225494 A1* | 8/2017 | Tokunaga | ............... | B41J 11/006 |
| 2018/0229497 A1* | 8/2018 | Darrow | ................ | B41J 2/04586 |
| 2018/0257099 A1* | 9/2018 | Miyazaki | ............. | B41J 2/04586 |
| 2018/0257101 A1* | 9/2018 | Miyazaki | ................. | B41J 2/145 347/40 |
| 2018/0261472 A1* | 9/2018 | Miyazaki | ............... | B41J 2/2135 |

FOREIGN PATENT DOCUMENTS

| | | |
|---|---|---|
| JP | 2010-198028 A | 9/2010 |
| JP | 2017-013011 A | 1/2017 |
| KR | 10-2017-0004866 A | 1/2017 |

\* cited by examiner

*FIG. 6A*
PULSE INSERTION

*FIG. 6B*
PULSE ELIMINATION

*FIG. 6C*
PULSE PITCH-INCREASING
CONVERSION

*FIG. 6D*
PULSE PITCH-DECREASING
CONVERSION

WORKPIECE PROCESSING APPARATUS USING WORKPIECE HAVING REFERENCE MARKS, WORKPIECE PROCESSING METHOD, AND COMPUTER STORAGE MEDIUM

CROSS-REFERENCE TO RELATED APPLICATION

This application is based on and claims priority from Japanese Patent Application No. 2017-042750 filed on Mar. 7, 2017 with the Japan Patent Office, the disclosure of which is incorporated herein in its entirety by reference.

TECHNICAL FIELD

The present disclosure relates to a workpiece processing apparatus which performs a predetermined processing on a workpiece, a workpiece processing method using the workpiece processing apparatus, and a computer storage medium.

BACKGROUND

In the related art, as an apparatus for drawing a pattern on a workpiece using a functional liquid, there has been known an inkjet type droplet ejecting apparatus which ejects the droplets of the functional liquid. The droplet ejecting apparatus is widely used, for example, when manufacturing electro-optical devices (flat panel displays (FPD)) such as organic EL devices, color filters, liquid crystal display devices, plasma displays (PDP devices), and electron emitting devices (field emission (FED) devices or surface-condition electron-emitter display (SED) devices).

For example, a droplet ejecting apparatus disclosed in Japanese Patent Application Laid-Open No. 2010-198028 includes a functional liquid droplet ejecting head (droplet ejecting head) which ejects the droplets of a functional liquid, a workpiece stage (workpiece table) on which a workpiece is mounted, and a movement mechanism (linear motor) which moves the workpiece table in a direction in which a pair of support bases for guidance extends (main scanning direction). Further, the droplet ejecting apparatus draws a pattern on the workpiece by ejecting the functional liquid from the droplet ejecting head into a bank formed in advance on the workpiece while moving the workpiece relative to the droplet ejecting head using the workpiece table.

In the droplet ejecting apparatus, work alignment is performed in advance in order to eject the functional liquid accurately to a desired position on the workpiece. The workpiece table is configured to be rotatable and movable horizontally, and an image of an alignment mark of the workpiece is captured by an alignment camera provided above the workpiece table. Further, a horizontal position of the workpiece table is corrected based on the captured image, thereby performing the workpiece alignment. Thereafter, the aligned workpiece is moved to a predetermined position, and the functional liquid is ejected into the bank on the workpiece from the droplet ejecting head.

SUMMARY

According to an aspect of the present disclosure, there is provided a workpiece processing apparatus that performs a predetermined processing on a workpiece. The workpiece processing apparatus includes: a workpiece table configured to place the workpiece thereon; a processor configured to process the workpiece placed on the workpiece table; a movement mechanism configured to relatively move the workpiece table and the processor; a position measuring device configured to measure a position of the movement mechanism; a detector configured to detect a position of the workpiece placed on the workpiece table; and a corrector configured to calculate a positional correction amount of the workpiece table based on a measurement result of the position measuring device and a detection result of the detector.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DESCRIPTION OF EMBODIMENT

In the following detailed description, reference is made to the accompanying drawings, which form a part thereof. The illustrative embodiments described in the detailed description, drawings, and claims are not meant to be limiting. Other exemplary embodiments may be utilized, and other changes may be made without departing from the spirit or scope of the subject matter presented here.

However, after the workpiece is aligned, a positional relationship between a droplet ejecting head and a bank on a workpiece is changed in some instances due to various factors. For example, examples of the factors may include deformation in a structure or a workpiece due to a change in temperature, thermal extension and contraction of a linear scale provided on a linear motor, changes over time in a mechanism, deformation in a floor or a building on/in which a droplet ejecting apparatus is installed, a difference in placed states of workpieces on a workpiece table (deviation between postures of workpieces), and the like. Further, examples of the factors may further include Abbe errors of a position of the linear motor and a surface of the workpiece table, a backlash error when the workpiece table reciprocally moves, positional deviation of a functional liquid ejecting head, and deterioration in precision of an apparatus.

Recently, large and high-definition (e.g., 4K or 8K) products have become mainstream in the products such as televisions manufactured using droplet ejecting apparatuses, and the droplet ejecting apparatus are also enlarged as the sizes of the workpieces are enlarged. For this reason, the positional deviation between the droplet ejecting head and the bank due to the aforementioned factors, that is, the positional deviation which occurs while the droplets ejected from the droplet ejecting head land on the bank on the workpiece cannot be ignored. Furthermore, due to the influence of a pixel size, the tolerance range of the positional deviation is also decreased to, for example, ±2 μm or less.

Therefore, in a stage requiring precision control, like the droplet ejecting apparatus, there is a need for a demand of correcting a position of the workpiece table, which is capable of robustly coping with a change in environment. In addition, the precise stage is also used for, for example, a machine tool or a coating apparatus for applying a processing liquid as well as the droplet ejecting apparatus. These apparatuses also require the technology of correcting the position of the workpiece table. However, at present, the workpiece table cannot be appropriately corrected in such a precise stage.

The present disclosure has been made in consideration of the aforementioned situations, and an object of the present disclosure is to align a processor and a workpiece with high precision by appropriately correcting a relative position of a workpiece table with respect to the processor in a workpiece processing apparatus for performing predetermined processing on the workpiece.

According to an aspect of the present disclosure, there is provided a workpiece processing apparatus that performs a predetermined processing on a workpiece. The workpiece processing apparatus includes: a workpiece table configured to place the workpiece thereon; a processor configured to process the workpiece placed on the workpiece table; a movement mechanism configured to relatively move the workpiece table and the processor; a position measuring device configured to measure a position of the movement mechanism; a detector configured to detect a position of the workpiece placed on the workpiece table; and a corrector configured to calculate a positional correction amount of the workpiece table based on a measurement result of the position measuring device and a detection result of the detector.

According to the present disclosure, even if positional deviation of the workpiece with respect to the processor occurs due to factors such as a change in temperature or a change with time in each of the members of the workpiece processing apparatus, it is possible to align the processor and the workpiece with high precision by appropriately correcting a relative position of the workpiece table with respect to the processor. Furthermore, with the correction of the relative position, the workpiece processing apparatus and the workpiece processing method may be considerably simplified.

Hereinafter, exemplary embodiments of the present disclosure will be described with reference to the accompanying drawings. In the present exemplary embodiment, a configuration which draws a pattern by ejecting the droplets of a functional liquid onto a workpiece so as to process the workpiece will be described. In addition, in the present exemplary embodiment, a droplet ejecting apparatus is used as a workpiece processing apparatus. However, the present disclosure is not limited by the exemplary embodiments disclosed below.

<Configuration of Droplet Ejecting Apparatus>

Figure 1:
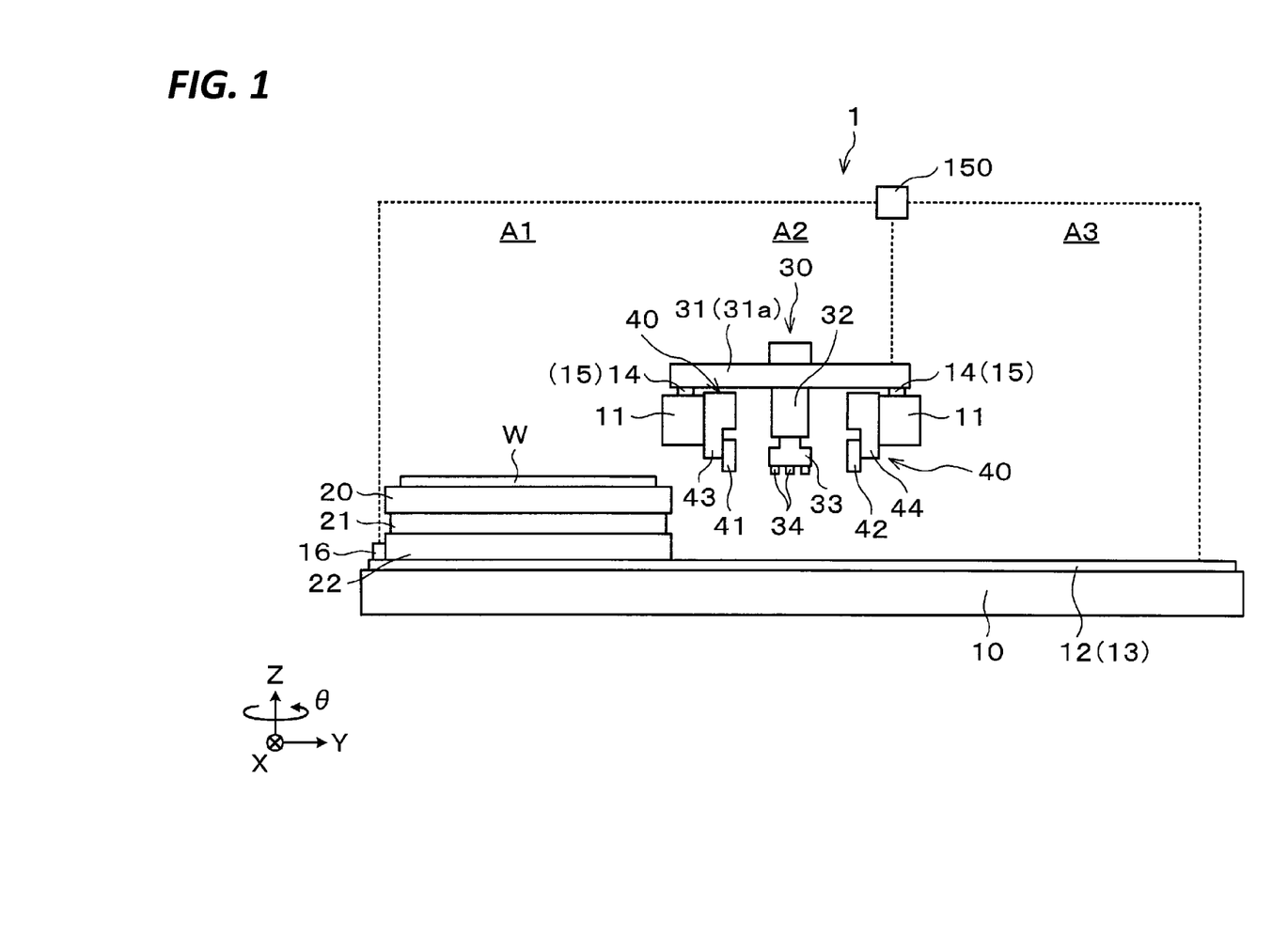
FIG. 1 is a side view illustrating an outline of a configuration of a droplet ejecting apparatus according to the present exemplary embodiment.
Figure 2:
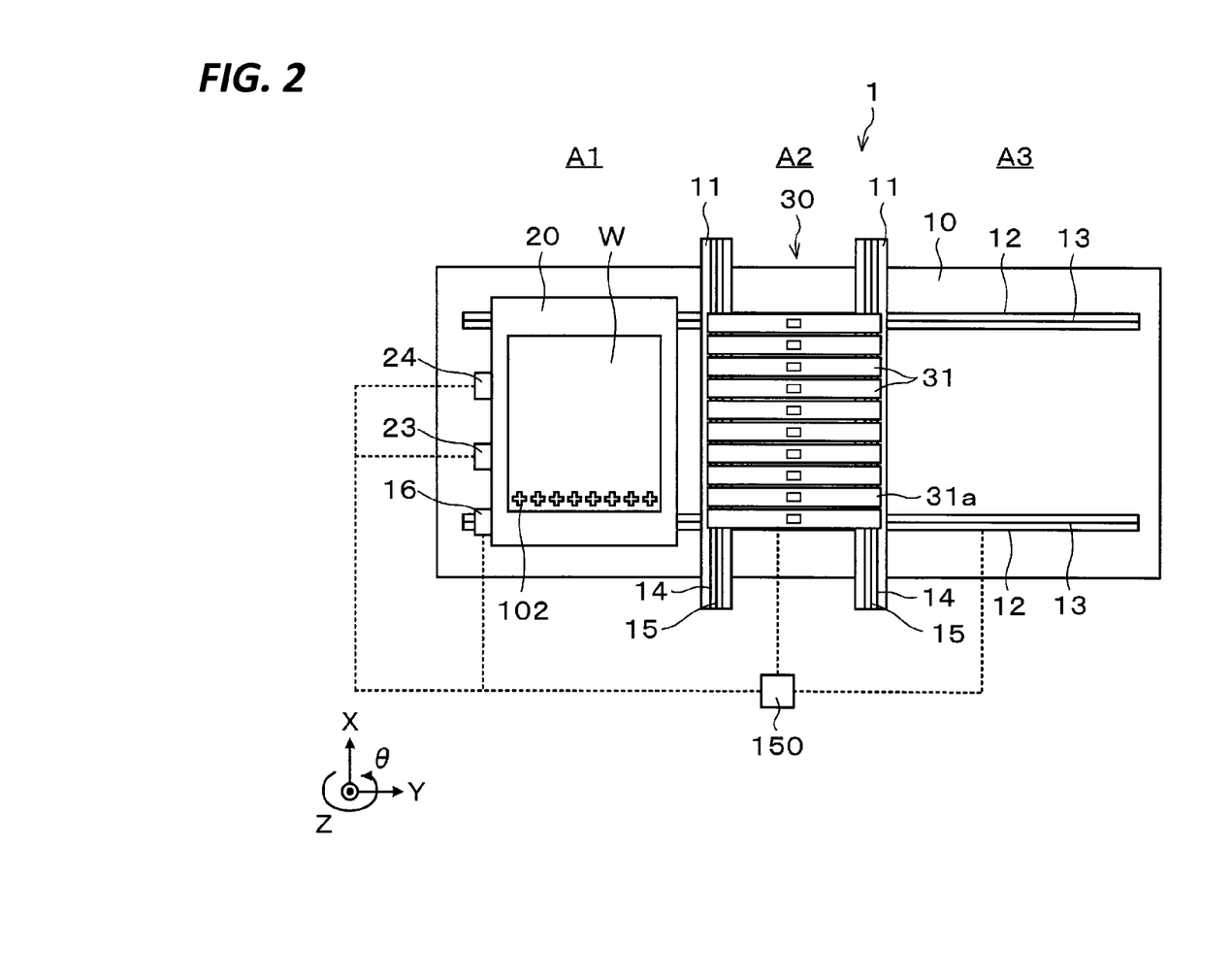
FIG. 2 is a top plan view illustrating an outline of the configuration of the droplet ejecting apparatus according to the present exemplary embodiment.

First, a configuration of a droplet ejecting apparatus according to the present exemplary embodiment will be described with reference to FIGS. 1 and 2. FIG. 1 is a side view illustrating an outline of a configuration of a droplet ejecting apparatus 1. FIG. 2 is a top plan view illustrating an outline of the configuration of the droplet ejecting apparatus 1. Further, hereinafter, a main scanning direction of a workpiece W is defined as a Y-axis direction, a sub-scanning direction orthogonal to the main scanning direction is defined as an X-axis direction, a vertical direction orthogonal to the Y-axis direction and the X-axis direction is defined as a Z-axis direction, and a rotation direction about the Z-axis is defined as a θ direction.

Figure 3:
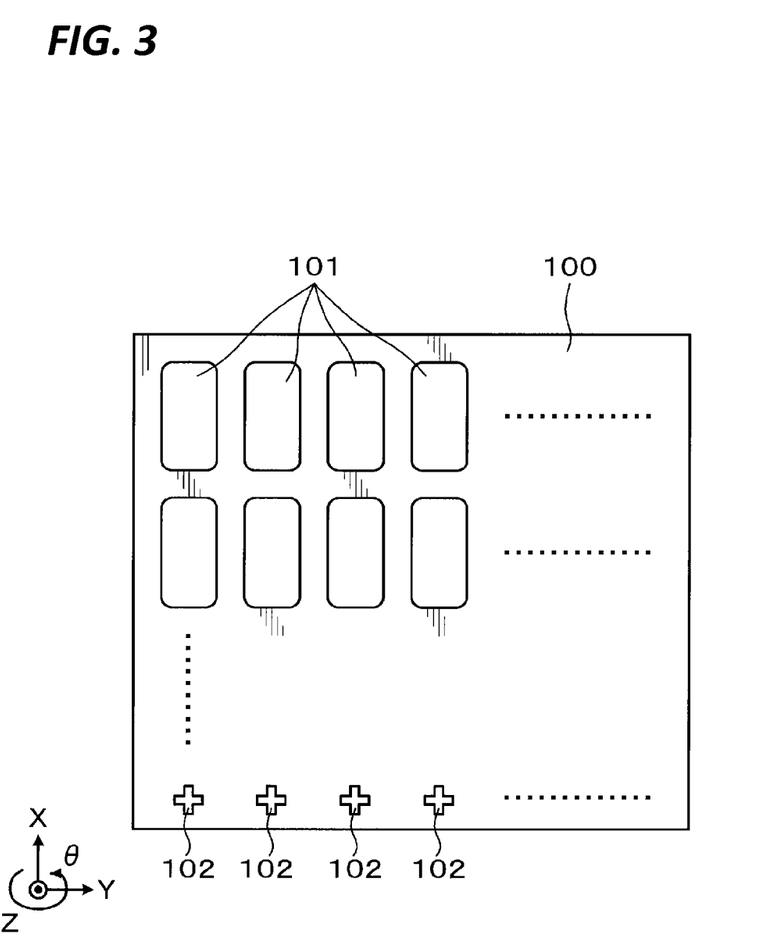
FIG. 3 is a top plan view illustrating a state in which a bank and reference marks are formed on a workpiece.

As illustrated in FIG. 3, a bank 100, which is a partition wall, is formed on the workpiece W used in the present exemplary embodiment. The bank 100 is patterned in a predetermined pattern by performing, for example, a photolithography processing, an etching processing, or the like. A plurality of openings 101 having a substantially rectangular shape are formed in the bank 100 side by side with a predetermined pitch in a row direction (Y-axis direction) and a column direction (X-axis direction). The inside of each of the openings 101 is a landing region, and droplets ejected by the droplet ejecting apparatus 1 are caused to land inside the openings 101. Further, the bank 100 is made of, for example, a photosensitive polyimide resin.

A plurality of reference marks 102 are formed, at an end of the workpiece W, in the Y-axis direction at a pitch equal to the pitch of the openings 101. The reference marks 102 are drawn on an upper surface of the workpiece W using, for example, an inkjet type drawing method. Further, in FIG. 3, nearly cross-shaped marks are drawn as the reference marks 102. However, the shape of the reference marks 102 is not limited by the contents of the present exemplary embodiment. For example, circular or triangular marks may be drawn, and any marks may be arbitrarily set as long as the marks can be identified. In addition, FIG. 3 illustrates a state in which the reference marks 102 are formed at the end of the workpiece W at the negative side in the X-axis direction, but the reference marks 102 may be formed at the end of the workpiece W at the positive side in the X-axis direction.

The droplet ejecting apparatus 1 has a Y-axis stage 10 extending in the main scanning direction (Y-axis direction) and moving the workpiece W in the main scanning direction, and a pair of X-axis stages 11 and 11 crossing over the Y-axis stage 10 and extending in the sub-scanning direction (X-axis direction). A pair of Y-axis guide rails 12 and 12 is provided to extend in the Y-axis direction on an upper surface of the Y-axis stage 10, and Y-axis linear motors 13 and 13, as a movement mechanism, are provided on the Y-axis guide rails 12 and 12, respectively. X-axis guide rails 14 and 14 are provided to extend in the X-axis direction on upper surfaces of the X-axis stages 11 and 11, respectively, and X-axis linear motors 15 and 15 are provided on the X-axis guide rails 14 and 14, respectively. Further, in the following description, on the Y-axis stage 10, an area at the negative side with respect to the X-axis stages 11 in the Y-axis direction is defined as a loading and unloading area A1, an area between the pair of X-axis stages 11 and 11 is defined as a processing area A2, and a positive side area with respect to the X-axis stages 11 in the Y-axis direction is defined as a standby area A3.

A Y-axis linear scale 16, as a position measuring device for measuring a position of the Y-axis linear motor 13, is provided on the Y-axis linear motor 13. An encoder pulse (pulse signal), which indicates the position of the Y-axis linear motor 13, is output from the Y-axis linear scale 16. Further, the position of the Y-axis linear motor 13 means a position of a movable element of the Y-axis linear motor 13.

A workpiece table 20 is provided on the Y-axis stage 10. Carriage units 30 and image capturing units 40 are provided on the pair of X-axis stages 11 and 11.

The workpiece table 20 is, for example, a vacuum suction table, and is configured to mount the workpiece W thereon by holding the workpiece W by suction. The workpiece table 20 is supported by a table movement mechanism 21 provided at a lower side of the workpiece table 20 so that the workpiece table 20 is movable in the X-axis direction and rotatable in the θ direction. The workpiece table 20 and the table movement mechanism 21 are supported on a Y-axis slider 22 provided at a lower side of the table movement mechanism 21. The Y-axis slider 22 is mounted on the Y-axis guide rails 12 and configured to be movable in the Y-axis direction by the Y-axis linear motors 13. Therefore, the workpiece table 20 is moved by the Y-axis slider 22 in the Y-axis direction along the Y-axis guide rails 12 in a state in which the workpiece W is placed on the workpiece table 20 such that the workpiece W may be moved in the Y-axis direction. Further, in the present exemplary embodiment, the table movement mechanism 21 is configured to move the workpiece table 20 in the X-axis direction and rotate the workpiece table 20 in the θ direction, but a mechanism for moving the workpiece table 20 in the X-axis direction and a mechanism for rotating the workpiece table 20 in the θ direction may be separately provided.

The table movement mechanism 21 is provided with an X-axis linear scale 23 which measures a position of the table movement mechanism 21 in the X-axis direction, and a rotary encoder 24 which measures a position of the table movement mechanism 21 in the θ direction. Encoder pulses (pulse signals), which indicate the position of the table movement mechanism 21 (workpiece table 20) in the X-axis direction and the position of the table movement mechanism 21 (workpiece table 20) in the θ direction, respectively, are output from the X-axis linear scale 23 and the rotary encoder 24, respectively.

A workpiece alignment camera (not illustrated), which captures an image of the workpiece W placed on the workpiece table 20, is provided above the workpiece table 20 in the loading and unloading area A1. Further, based on the image captured by the workpiece alignment camera, the position in the Y-axis direction, the position in the X-axis direction, and the position in the θ direction of the workpiece W placed on the workpiece table 20 are corrected by the Y-axis slider 22 and the table movement mechanism 21, as necessary. Therefore, the workpiece W is aligned such that a predetermined initial position of the workpiece W is set.

A plurality of (e.g., ten) carriage units 30 are provided on the X-axis stages 11. Each of the carriage units 30 has a carriage plate 31, a carriage holding mechanism 32, a carriage 33, and a droplet ejecting head 34 as a processor. The carriage holding mechanism 32 is provided at the center of a lower side of the carriage plate 31, and the carriage 33 is detachably mounted on the lower end of the carriage holding mechanism 32.

The carriage plate 31 is mounted on the X-axis guide rails 14 and may be moved by the X-axis linear motors 15 in the X-axis direction. Further, a plurality of carriage plates 31 may be integrally moved in the X-axis direction.

A motor (not illustrated) is mounted on the carriage 33. The carriage 33 is configured to be movable in the X-axis direction and the θ direction by the motor. Further, the movements of the carriage 33 in the X-axis direction and the θ direction may be performed by, for example, the carriage holding mechanism 32.

A plurality of droplet ejecting heads 34 are arranged side by side in the Y-axis direction and the X-axis direction at a lower side of the carriage 33. In the present exemplary embodiment, for example, the six droplet ejecting heads 34 are provided in the Y-axis direction, and the two droplet ejecting heads 34 are provided in the X-axis direction. That is, the total of twelve droplet ejecting heads 34 are provided. A plurality of ejecting nozzles (not illustrated) are disposed in a lower surface, that is, a nozzle surface of the droplet ejecting head 34. Further, the droplets of a functional liquid are ejected from the ejecting nozzles to droplet ejecting positions directly under the droplet ejecting heads 34.

The image capturing units 40 are disposed at a position which approximately overlaps, in a plan view, a trajectory of the reference marks 102 on the workpiece W when the workpiece table 20 is moved in the Y-axis direction by the Y-axis linear motors 13. Specifically, as illustrated in, for example, FIG. 2, the image capturing unit 40 is provided on the carriage plate 31a when the second carriage plate 31a from the lower side at the negative side in the X-axis direction approximately overlaps the trajectory of the reference marks 102 when the workpiece W is moved in the Y-axis direction. Further, the image capturing unit 40 may be configured to be movable in the X-axis direction.

The image capturing units 40 include a first image capturing unit 41 and a second image capturing unit 42 which are provided to face each other in the Y-axis direction with the carriage 33 (droplet ejecting head 34) interposed therebetween. For example, a CCD camera is used as the first image capturing unit 41 and the second image capturing unit 42, and the first image capturing unit 41 and the second image capturing unit 42 may capture images of the workpiece W placed on the workpiece table 20 even while the workpiece table 20 is being moved or stopped or workpiece processing (ejecting of droplet) is performed. The first image capturing unit 41 is disposed at the negative side in the Y-axis direction with respect to the carriage 33, and the second image capturing unit 42 is disposed at the positive side in the Y-axis direction with respect to the carriage 33.

The first image capturing unit 41 captures an image of the reference mark 102 formed on the workpiece W. The first image capturing unit 41 is supported on a base 43 provided at a side of the X-axis stage 11 of the pair of X-axis stages 11 and 11 which is provided at the negative side in the Y-axis direction. Further, when the workpiece W is moved from the loading and unloading area A1 toward the processing area A2 and the workpiece table 20 is guided to a position directly under the first image capturing unit 41, the first image capturing unit 41 captures images of the workpiece W placed on the workpiece table 20 at a predetermined cycle. The acquired captured images are input to a detector 160 of a control unit 150 which will be described below. Further, an image capturing timing of the first image capturing unit 41 may be determined, for example, based on the converted pulse signal which is output from a corrector 161 to be described below, or the image capturing timing of the first image capturing unit 41 may be predetermined before the workpiece processing.

The second image capturing unit 42 is supported on a base 44 provided at a side of the X-axis stage 11 which is provided at a positive side in the Y-axis direction among the pair of X-axis stages 11 and 11. Further, when the workpiece table 20 is guided to a position directly under the second image capturing unit 42, the second image capturing unit 42 captures an image of the workpiece W placed on the workpiece table 20, thereby capturing an image of the droplets landing on the upper surface of the workpiece W.

The captured images of the workpiece W, which are captured by the first image capturing unit 41 and the second image capturing unit 42, are identical to the aforementioned captured images when the workpiece table 20 passes forward (to the positive side in the Y-axis direction), but the images of the workpiece W, which are captured by the first image capturing unit 41 and the second image capturing unit 42, are opposite to the aforementioned captured images when the workpiece table 20 passes backward (to the negative side in the Y-axis direction).

<Control Unit>

The droplet ejecting apparatus 1 is provided a control unit 150. The control unit 150 is, for example, a computer and has a data storing unit (not illustrated). For example, the data storing unit stores drawing data (bitmap data) for drawing a predetermined pattern on the workpiece W by controlling the droplets which are ejected onto the workpiece W. In addition, the control unit 150 has a program storing unit (not illustrated). The program storing unit stores a program for controlling various types of processing in the droplet ejecting apparatus 1.

The data or the program are recorded in, for example, a computer-readable storage medium such as a computer-readable hard disk (HD), a flexible disk (FD), a compact disk (CD), a magneto-optical disk (MO), and a memory card, and may be installed in the control unit 150 from the storage medium.

Figure 4:
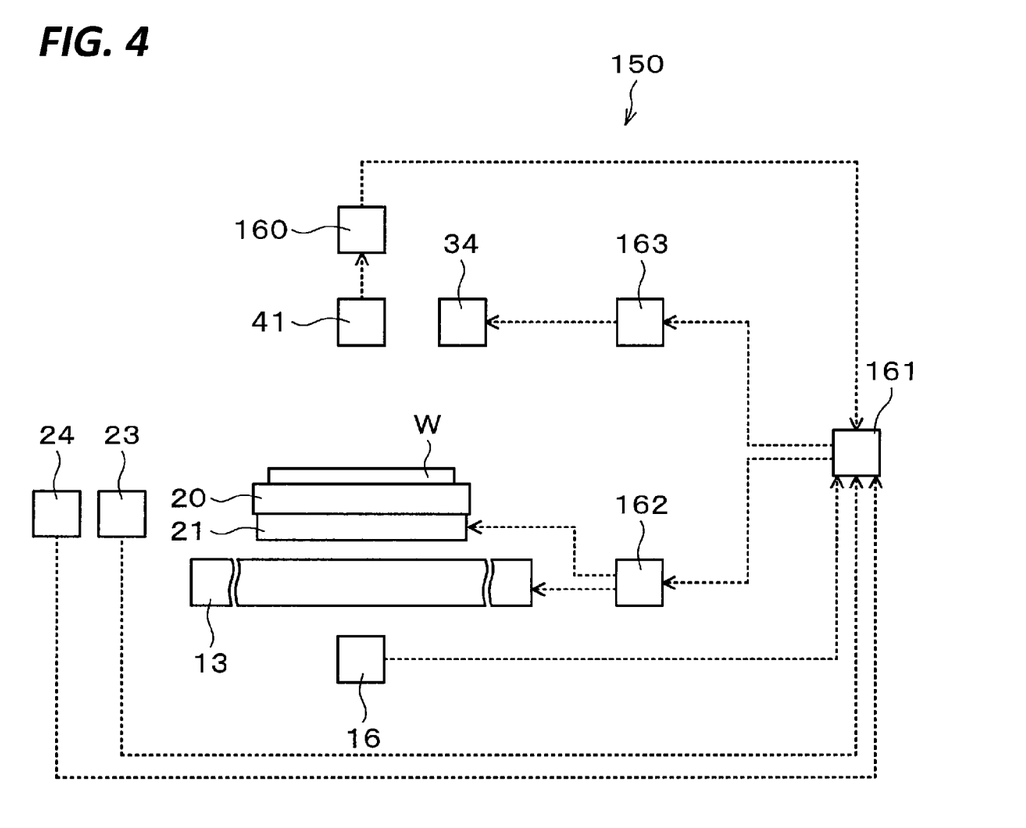
FIG. 4 is an explanatory view schematically illustrating an outline of a configuration of a control unit.

As illustrated in FIG. 4, the control unit 150 has a detector 160 which detects the positions of the reference marks 102 from the captured image by processing a captured image acquired by the first image capturing unit 41, a corrector 161 which corrects the position of the workpiece table 20 (positions of the Y-axis linear motor 13 and the table movement mechanism 21), a motion controller 162 (motion driver) which controls the movements of the Y-axis linear motors 13 and the table movement mechanism 21, and an inkjet controller 163 which controls an ejecting timing of the droplet ejecting head 34.

(Detector)

Any method of detecting the positions (center positions) of the reference marks 102 using the detector 160 may be used, but, for example, a method disclosed in Japanese Patent Application Laid-Open No. 2017-013011 may be used. Further, the detector 160 detects the position of the workpiece W by detecting the positions of the plurality of reference marks 102. In addition, the first image capturing unit 41 is provided on the X-axis stages 11 on which the droplet ejecting head 34 is mounted, and as a result, the detector 160 detects the position of the workpiece W with respect to the droplet ejecting head 34. Further, the captured image acquired by the first image capturing unit 41 includes a Y-axis component, an X-axis component, and a θ component, and the positions of the workpiece W detected by the detector 160 include a position in the Y-axis direction, a position in the X-axis direction, and a position in the θ direction.

Based on the detected position of the workpiece W, the detector 160 may further calculate the positional deviation amount of from a target position of the workpiece W. Any method of calculating the positional deviation amount of the workpiece W may be used, but for example, the method disclosed in Japanese Patent Application Laid-Open No. 2017-013011 may be used. That is, based on the position of the Y-axis linear motor 13 measured by the Y-axis linear scale 16, the target position of the workpiece W is estimated using the method. Further, the positional deviation amount is calculated by comparing the calculated target position of the workpiece W with the position of the workpiece W detected by the detector 160. Further, the positional deviation amount of the workpiece W includes a position in the Y-axis direction, a pitch in the Y-axis direction, a yaw in the Y-axis direction, a position in the X-axis direction based on the position in the Y-axis direction, and a position in the θ direction based on the position in the Y-axis direction.

Figure 5:
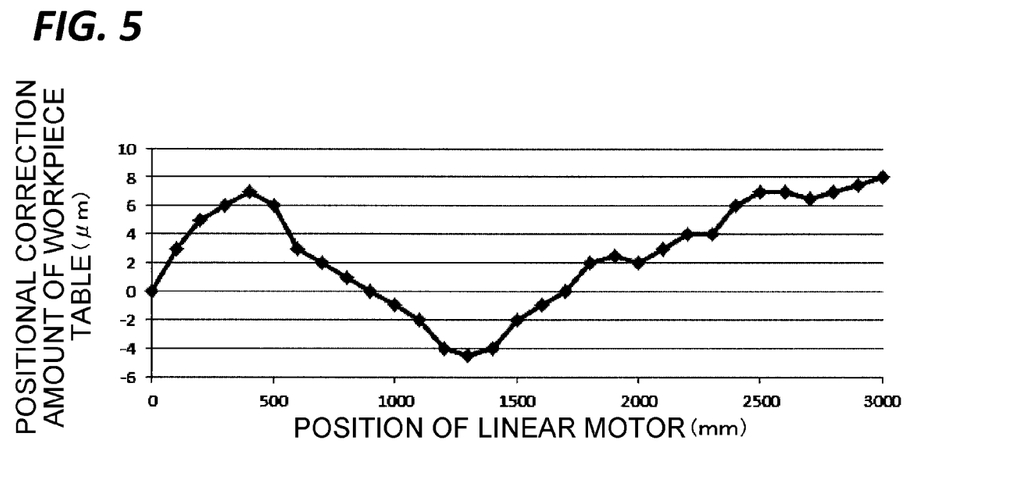
FIG. 5 is a view illustrating an example of a correction table.

Based on the positional deviation amount of the workpiece W which is calculated as described above, the detector 160 may further create a correction table illustrated in FIG. 5. The correction table is created by plotting the positional deviation amount of the workpiece W in the Y-axis direction with respect to the position of the Y-axis linear motor 13 for one stroke of the Y-axis linear motor 13, for example, for each pitch of 100 mm. The positional deviation amount of the workpiece W indicates the positional correction amount of the workpiece W, that is, the positional correction amount of the workpiece table 20. Therefore, a horizontal axis of the correction table indicates the position of the Y-axis linear motor 13, a vertical axis of the correction table indicates the positional correction amount of the workpiece table 20, and the correction table indicates how much the position of the workpiece table 20 may be moved with respect to the position of the Y-axis linear motor 13 measured by the Y-axis linear scale 16. Further, the correction table illustrated in FIG. 5 indicates an example of the positional correction amount of the workpiece table 20 in the Y-axis direction, but the correction tables are created in respect to the pitch in the Y-axis direction, the yaw in the Y-axis direction, the position in the X-axis direction based on the position in the Y-axis direction, and the position in the θ direction based on the position in the Y-axis direction, respectively, in addition to the position of the workpiece table 20 in the Y-axis direction. Therefore, a posture of the workpiece table 20 may be corrected by correcting the position of the Y-axis linear motor 13 in the Y-axis direction and correcting the positions of the table movement mechanism 21 in the X-axis direction and the θ direction. Further, the correction table illustrated in FIG. 5 is created by performing two-dimensional interpolation on the plotting, but multidimensional interpolation may be performed.

As described above, the detector 160 calculates any one of the position of the workpiece W, the positional deviation amount of the workpiece W, and the correction table. Further, a signal of a detection result of the detector 160 is output to the corrector 161. Further, the correction table is created by the corrector 161 in the case in which the position of the workpiece W or the positional deviation amount of the workpiece W is output from the detector 160 to the corrector 161.

In the foregoing description, the detector 160 detects the position of the workpiece W using the image captured by the first image capturing unit 41, but this process is performed when the workpiece table 20 (Y-axis linear motor 13) is moved from the loading and unloading area A1 to the processing area A2 (forward pass). Meanwhile, the detector 160 detects the position of the workpiece W using the image captured by the second image capturing unit 42 when the workpiece table 20 is moved from the standby area A3 to the processing area A2 (backward pass).

The detector 160 detects the position of the workpiece W using the captured image of the workpiece W captured by the first image capturing unit 41. However, for example, a reference mark may be provided on the workpiece table 20 and the captured image of the workpiece table 20 including the reference mark may be used.

The detector 160 detects the position of the workpiece W based on the captured image acquired by the first image capturing unit 41 which is the CCD camera. However, for example, the detector 160 may detect the position of the workpiece W using a laser interferometer (not illustrated) or a laser displacement meter (not illustrated). In the case in which the laser interferometer or the laser displacement meter is used, the position of the workpiece W with respect to the droplet ejecting head 34 is detected by emitting a laser beam to the droplet ejecting head 34 and the workpiece table 20 or the workpiece W. In this case, the position in the Y-axis direction is detected as the position of the workpiece W in a case in which the position of the workpiece W is measured using, for example, a length measuring device (the laser interferometer or the laser displacement meter) disposed in a single row, and the position in the Y-axis direction and the position in the θ direction are detected in a case in which, for example, length measuring devices disposed at two rows are used.

(Corrector)

Based on a pulse signal from the Y-axis linear scale 16 and a signal from the detector 160, the corrector 161 calculates the positional correction amount of the workpiece table 20 using the correction table. Further, the positional correction amount is fed back to the motion controller 162. Specifically, the following steps S1 to S3 are performed.

First, the corrector 161 recognizes the current position of the Y-axis linear motor 13 by receiving and counting the pulse signal from the Y-axis linear scale 16. In addition, the corrector 161 analyzes a shape (pulse shape) of the pulse signal from the Y-axis linear scale 16 in order to convert the pulse signal in the following step S3 (step S1). In step S1, the corrector 161 also receives the pulse signal from the X-axis linear scale 23 and the pulse signal from the rotary encoder 24.

Next, the corrector 161 receives the signal of the detection result from the detector 160. The signal from the detector 160 corresponds to any one of the position of the workpiece W, the positional deviation amount of the workpiece W, and the correction table as described above. In addition, in the case in which the signal from the detector 160 correspond to the position of the workpiece W or the positional deviation amount of the workpiece W, the correction table is created by the corrector 161. Further, based on the position of the Y-axis linear motor 13 recognized in step S1, the positional correction amount of the workpiece table 20 is calculated using the correction table. Specifically, two-dimensional interpolation or multidimensional interpolation is performed on the correction table. Further, FIG. 5 illustrates the correction table created by the two-dimensional interpolation. The calculation of the positional correction amount is performed while the Y-axis linear motor 13 (workpiece table 20) is moved, and the positional correction amount is calculated corresponding to the position of the Y-axis linear motor 13 which is changed from moment to moment. Therefore, the corrector 161 calculates the positional correction amount of the workpiece table 20 at the current position in real time (step S2).

Figure 6A:
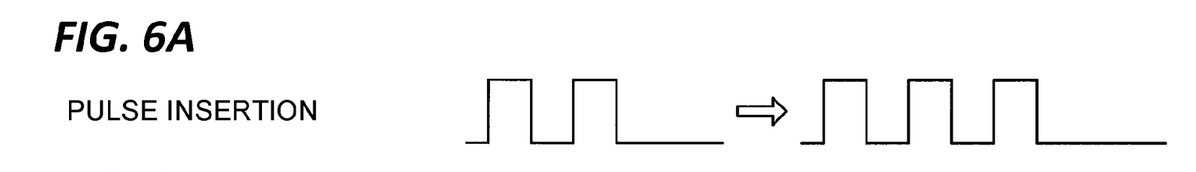
FIGS. 6A to 6D are explanatory views each illustrating a state in which a pulse signal is converted by a corrector.
Figure 6B:
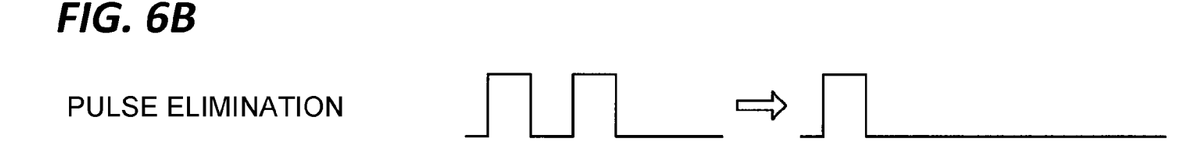
Figure 6C:
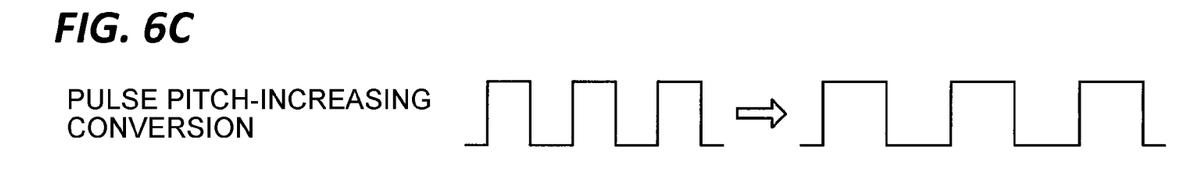
Figure 6D:
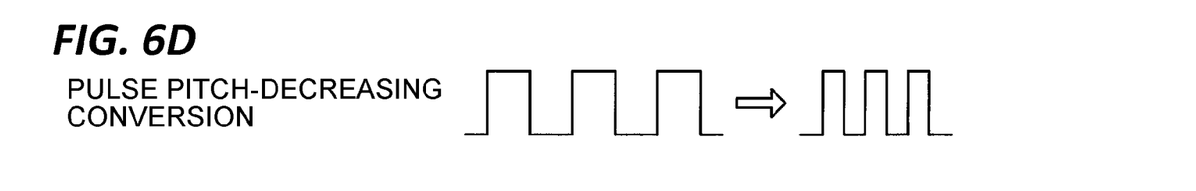

Next, based on the pulse shape analyzed in step S1 and the positional correction amount of the workpiece table 20 in the Y-axis direction calculated in step S2, the corrector 161 converts the pulse signal received from the Y-axis linear scale 16. FIGS. 6A to 6D illustrate states of converting pulse signals, in which the left view illustrates the pulse signals received from the Y-axis linear scale 16, and the right view illustrates the pulse signals output to the motion controller 162 after conversion. For example, in the case in which the positions of the plurality of reference marks 102 deviate overall with respect to a pulse signal, the pulse is inserted as illustrated in FIG. 6A, or the pulse is eliminated as illustrated in FIG. 6B. In addition, for example, when it is desired to impart a slope to the pulse signal in the case in which the workpiece W is expanded and contracted from the positions of the plurality of reference marks 102, the pulse pitch is increased as illustrated in FIG. 6C, or the pulse pitch is decreased as illustrated in FIG. 6D. Further, the converted pulse signal is output to the motion controller 162 (step S3).

The pulse signal, which is converted in step S3 as described above, is also output to the inkjet controller 163. The inkjet controller 163 controls the droplet ejecting timing of the droplet ejecting head 34, and the droplet ejecting timing is set based on the position of the Y-axis linear motor 13. In the present exemplary embodiment, the pulse signal output from the corrector 161 is output to the inkjet controller 163, and as a result, it is possible to eject the droplets from the droplet ejecting head 34 at an appropriate timing.

In step S3, based on the positional correction amounts of the workpiece table 20 in the X-axis direction and the θ direction which are calculated in step S2, the corrector 161 converts the pulse signal from the X-axis linear scale 23 and the pulse signal from the rotary encoder 24. The converted pulse signals are output to the motion controller 162.

In the case in which the Y-axis linear motor 13 is moved at a high speed, the corrector 161, which calculates the positional correction amount in real time, needs to perform a high-speed processing. For this reason, the corrector 161 may be implemented to have functions of an application specific integrated circuit (ASIC) or a field programmable gate array (FPGA).

(Motion Controller)

Based on the pulse signal (pulse signal after conversion) in the Y-axis direction which is received from the corrector 161, the motion controller 162 controls the movement of the Y-axis linear motor 13 (workpiece table 20) by outputting a command signal (pulse train) to the Y-axis linear motor 13. In addition, based on the pulse signals (pulse signals after conversion) in the X-axis direction and the θ direction which are received from the corrector 161, the motion controller 162 controls the movement of the table movement mechanism 21 by outputting the command signal (pulse train) to the table movement mechanism 21. Further, the motion controller 162 receives the pulse signal related to the Y axis, the X axis, and the θ, thereby configuring fully closed control.

(Inkjet Controller)

Based on the pulse signal (pulse signal after conversion) in the Y-axis direction which is received from the corrector 161, the inkjet controller 163 controls the droplet ejecting timing of the droplet ejecting head 34 by outputting the command signal (pulse train) to the droplet ejecting head 34.

<Processing on Workpiece in Droplet Ejecting Apparatus>

Next, a processing performed on the workpiece performed using the droplet ejecting apparatus 1 configured as described above will be described.

First, the workpiece table 20 is disposed in the loading and unloading area A1, and a workpiece W, which is loaded into the droplet ejecting apparatus 1 by a transport mechanism (not illustrated), is placed on the workpiece table 20. Next, an image of the workpiece W placed on the workpiece table 20 is captured by the workpiece alignment camera. Further, based on the captured image, the positions of the workpiece W, which is placed on the workpiece table 20, in the X-axis direction and the θ direction are corrected by the table movement mechanism 21 such that the workpiece W is aligned (step T1).

Figure 7:
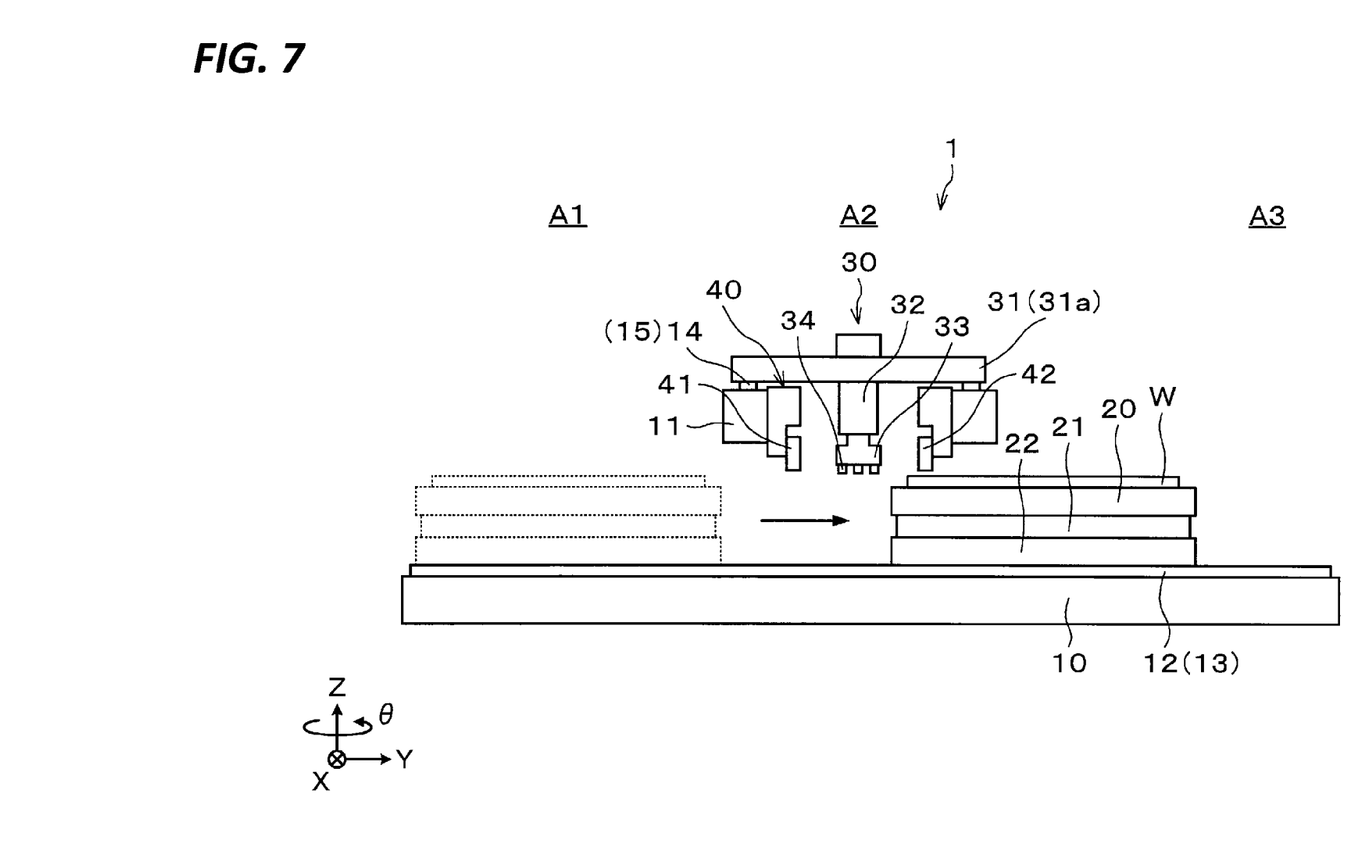
FIG. 7 is an explanatory view illustrating a state in which a workpiece is moved toward a droplet ejecting head.

Thereafter, the workpiece table 20 is moved by the Y-axis linear motors 13 from the loading and unloading area A1 to the processing area A2. In the processing area A2, the droplets are ejected from the droplet ejecting head 34 onto the workpiece W which is moved to the position under the droplet ejecting head 34. Further, as illustrated in FIG. 7, the workpiece table 20 is further moved to the standby area A3 so that the entire surface of the workpiece W passes through the lower side of the droplet ejecting head 34. Further, the workpiece W is reciprocally moved in the Y-axis direction and moved appropriately in the X-axis direction such that a predetermined pattern is drawn on the workpiece W (step T2).

Here, in step T2, the position of the Y-axis linear motor 13 is measured in real time by the Y-axis linear scale 16 while the workpiece table 20 is moved from the loading and unloading area A1 to the processing area A2 when the workpiece table 20 passes forward, that is, before the droplets are ejected onto the workpiece W from the droplet ejecting head 34 in the processing area A2. The pulse signal from the Y-axis linear scale 16 is output to the corrector 161. In addition, the positions of the table movement mechanism 21 in the X-axis direction and the θ direction are also measured by the X-axis linear scale 23 and the rotary encoder 24, respectively, and the pulse signal from the X-axis linear scale 23 and the pulse signal from the rotary encoder 24 are also output to the corrector 161.

Meanwhile, in this case, the first image capturing unit 41 captures images of the workpiece W placed on the workpiece table 20 at a predetermined cycle, and the detector 160 detects the position of the workpiece W. The detector 160 may further calculate the positional deviation amount of the workpiece W or the correction table. The signal of the detection result of the detector 160 is output to the corrector 161.

The corrector 161 performs the aforementioned steps S1 to S3. That is, based on the pulse signal from the Y-axis linear scale 16 and the signal from the detector 160, the corrector 161 calculates the positional correction amount of the workpiece table 20 using the correction table. Further, the pulse signals, which are converted based on the positional correction amount, are output to the motion controller 162 from the corrector 161. In addition, among the pulse signals, the pulse signal in the Y-axis direction is also output to the inkjet controller 163.

Based on the pulse signal (pulse signal after conversion) in the Y-axis direction which is received from the corrector 161, the motion controller 162 corrects the position of the Y-axis linear motor 13 by outputting the command signal (pulse train) to the Y-axis linear motor 13. In addition, based on the pulse signals (pulse signals after conversion) in the X-axis direction and the θ direction which are received from the corrector 161, the motion controller 162 controls the movement of the table movement mechanism 21 by outputting the command signal (pulse train) to the table movement mechanism 21. Meanwhile, the inkjet controller 163 also controls the droplet ejecting timing of the droplet ejecting head 34 by outputting the command signal to the droplet ejecting head 34. Therefore, the workpiece W placed on the workpiece table 20 is disposed at an appropriate position with respect to the droplet ejecting head 34.

The detector 160 detects the position of the workpiece W using the image captured by the second image capturing unit 42 while the workpiece table 20 is moved from the standby area A3 to the processing area A2 when the workpiece table 20 passes backward.

When the workpiece table 20 is moved to the loading and unloading area A1, the workpiece W on which the drawing processing is completed is unloaded from the droplet ejecting apparatus 1. Next, the next workpiece W is loaded into the droplet ejecting apparatus 1. Next, the workpiece W is aligned in the aforementioned step T1, and then step T2 is performed.

Steps T1 and T2 are performed on the respective workpieces W as described above, and then a series of processing on the workpieces ends.

According to the exemplary embodiment, even if positional deviation of the workpiece W occurs due to the factors such as a change in temperature or changes over time in the respective members of the droplet ejecting apparatus 1, it is possible to appropriately correct the position of the workpiece table 20 using the Y-axis linear scale 16, the detector 160, and the corrector 161. Therefore, it is possible to align the droplet ejecting head 34 and the workpiece W with high precision and improve ejecting precision (landing precision) of droplets onto the workpiece W from the droplet ejecting head 34.

According to the present exemplary embodiment, it is possible to appropriately correct the position of the workpiece table 20 even if the positional deviation of the droplet ejecting head 34 as well as the positional deviation of the workpiece W occurs in the droplet ejecting apparatus 1. Examples of the factors, which cause the positional deviation of the droplet ejecting head 34, may include the deviation of the ejecting timing caused by a variation in a thickness of the workpiece W, a variation in a gap between the droplet ejecting head 34 and the workpiece W, a variation in a landing timing of the droplet caused by a change in temperature or a change with time, a fixed positional deviation of the droplet ejecting head 34, and a change in temperature or a change with time in the droplet ejecting head 34.

The measurement of the position of the Y-axis linear motor 13 by the Y-axis linear scale 16 and the detection of the position of the workpiece W by the detector 160 are performed in real time before the droplets are ejected onto the workpiece W from the droplet ejecting head 34. Further, the correction table used by the corrector 161 may be freely created in accordance with changes in the respective members of the droplet ejecting apparatus 1 and may be renewed while the Y-axis linear motor 13 (workpiece table 20) moves. Therefore, it is possible to appropriately correct the position of the workpiece table 20.

Figure 9:
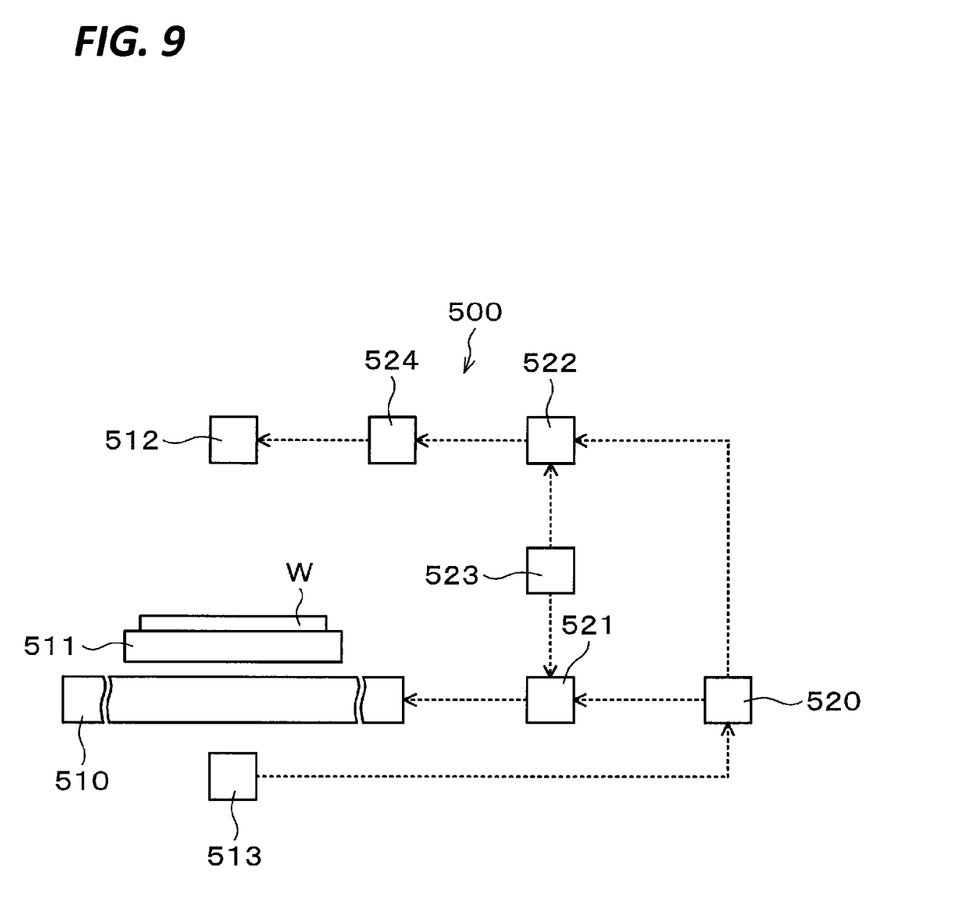
FIG. 9 is an explanatory view schematically illustrating an outline of a configuration of a position correcting apparatus in the related art.

The configuration (detector 160 and corrector 161) of the control unit 150 and the method of correcting the position of the workpiece table 20 are considerably simple. In addition, a position correcting apparatus 500 illustrated in the FIG. 9 described above has a restriction in selecting the configurations of the motion controller, the linear motor, and the linear scale, but the present exemplary embodiment has no restriction in this connection. The movement mechanism is not limited to the Y-axis linear motor 13, and a motor system may be applied. In addition, the position measuring device is also not limited to the Y-axis linear scale 16, and any position measuring device may be applied as long as the position measuring device is an encoder for measuring a position. Therefore, a degree of freedom in terms of selecting apparatuses is improved.

<Another Exemplary Embodiment>

Next, another exemplary embodiment of the present disclosure will be described.

In the exemplary embodiment described above, the correction table is created based on the position of the workpiece W detected by the detector 160, but other correction tables may be used.

Figure 8:
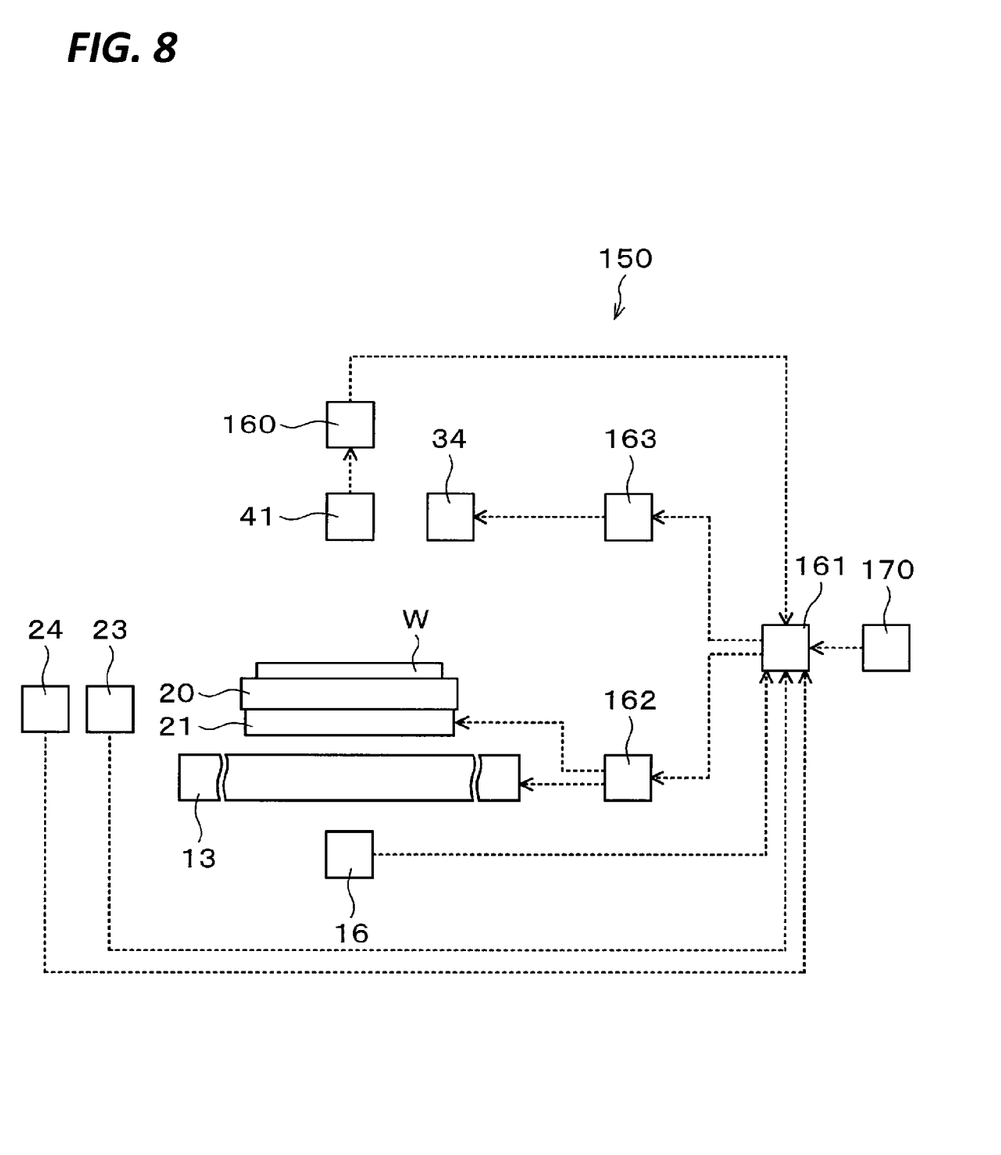
FIG. 8 is an explanatory view schematically illustrating an outline of a configuration of a control unit according to another exemplary embodiment.

For example, as illustrated in FIG. 8, the correction table may be stored in the computer 170, and the correction table may be installed in the corrector 161 from the computer 170. For example, in the case in which inherent properties such as a change in temperature or a change with time in a particular member of the droplet ejecting apparatus 1 are known, the computer 170 may create the correction table in advance based on the properties.

A variation table may overlap a base table when preparing the correction table. For example, the base table is a correction table created based on the inherent properties of the droplet ejecting apparatus 1. These properties do not greatly vary with time, and as a result, the base table is created when the apparatus starts up. For example, the variation table is a correction table created based on the position of the workpiece W detected by the detector 160. That is, the variation table is a correction table created based on factors that vary daily.

For example, the droplet ejecting apparatus 1 is provided with a thermometer (not illustrated), and the correction table may be created based on a result of measuring temperatures using the thermometer. In this case, for example, in the exemplary embodiment, a new correction table may be created by overlapping the correction table, which is created based on the result of measuring the temperatures, with the correction table created based on the position of the workpiece W.

In the exemplary embodiment described above, the correction table is calculated using the captured image of the workpiece W captured by the first image capturing unit 41 (second image capturing unit 42) before the droplets are ejected onto the workpiece W from the droplet ejecting head 34, but the correction table may be calculated using the captured image of the workpiece W captured after the droplets are ejected onto the workpiece W from the droplet ejecting head 34.

The droplets are also ejected onto the reference mark 102 when the droplets are ejected into the bank 100 of the workpiece W from the droplet ejecting head 34 in the processing area A2 after the workpiece table 20 is moved from the loading and unloading area A1 to the processing area A2 when the workpiece table 20 passes forward in the aforementioned step T2. Further, when the workpiece table 20 is moved from the processing area A2 to the standby area A3, the second image capturing unit 42 captures images of the workpiece W placed on the workpiece table 20 at a predetermined cycle, and the detector 160 detects the position of the workpiece W. Any method of detecting the positions (center positions) of the reference marks 102 on the workpiece W may be used, but for example, a method disclosed in Japanese Patent Application Laid-Open No. 2017-013012 may be used. Further, the signal of the detection result of the detector 160 is output to the corrector 161.

The corrector 161 performs the aforementioned steps S1 to S3. That is, based on the pulse signal from the Y-axis linear scale 16 and the signal from the detector 160, the corrector 161 calculates the positional correction amount of the workpiece table 20 in the Y-axis direction using the correction table. Further, the pulse signal in the Y-axis direction, which is converted based on the positional correction amount, is output to the motion controller 162 from the corrector 161. In addition, the positional correction amounts of the workpiece table 20 in the X-axis direction and the θ direction are calculated. Further, the pulse signals in the X-axis direction and the θ direction, which are converted based on the positional correction amounts, are also output to the motion controller 162 from the corrector 161.

Based on the pulse signal (pulse signal after conversion) in the Y-axis direction which is received from the corrector 161, the motion controller 162 corrects the position of the Y-axis linear motor 13 by outputting the command signal (pulse train) to the Y-axis linear motor 13. In addition, based on the pulse signals (pulse signals after conversion) in the X-axis direction and the θ direction which are received from the corrector 161, the motion controller 162 controls the movement of the table movement mechanism 21 by outputting the command signal (pulse train) to the table movement mechanism 21. As such, during the subsequent operation of ejecting droplets onto the workpiece W, it is possible to align the droplet ejecting head 34 and the workpiece W with high precision.

The detector 160 detects the position of the workpiece W using the image captured by the first image capturing unit 41 while the workpiece table 20 is moved from the standby area A3 to the processing area A2 when the workpiece table 20 passes backward.

An inspection apparatus, which is provided outside the droplet ejecting apparatus 1, may be used instead of the second image capturing unit 42 (first image capturing unit 41). The inspection apparatus inspects the workpiece W by capturing an image of the workpiece W after the droplets are ejected. The corrector 161 may use the image captured by the inspection apparatus to calculate the positional correction amount of the workpiece table 20.

In the exemplary embodiments described above, the workpiece table 20 is moved in the Y-axis direction, but the droplet ejecting head 34 may be moved in the Y-axis direction. In this case, the corrector 161 corrects the position of a Y-axis linear motor (not illustrated) which moves the droplet ejecting head 34.

Both of the workpiece table 20 and the droplet ejecting head 34 may be moved in the Y-axis direction. In this case, the corrector 161 corrects the position of the Y-axis linear motor 13 for moving the workpiece table 20 and corrects the position of the Y-axis linear motor (not illustrated) for moving the droplet ejecting head 34.

In the exemplary embodiment described above, the configuration in which the droplet ejecting apparatus 1 is used as the workpiece processing apparatus has been described, but the present disclosure may also be applied to other workpiece processing apparatuses as long as the apparatuses are provided with a precise stage for moving a workpiece. Examples of other workpiece processing apparatuses include a machine tool for processing a workpiece, a coating apparatus for coating a workpiece with a processing liquid, and the like.

The present disclosure is particularly useful in the case in which both a processor and a workpiece table are moved as in the droplet ejecting apparatus 1. In such a case, in the past, there was a risk that synchronization could not be achieved by correcting both of the movement of the processor and the movement of the workpiece table. However, in the present disclosure, since the correction is performed only by the corrector 161, it is possible to appropriately correct the position of the workpiece table 20.

<Application Example of Droplet Ejecting Apparatus>

The droplet ejecting apparatus 1 configured as described above is applied to, for example, a substrate processing system for forming an organic EL layer of an organic light emitting diode which is disclosed in Japanese Patent Application Laid-Open No. 2017-013011. Specifically, the droplet ejecting apparatus 1 is applied to a coating apparatus for applying an organic material for forming a hole injection layer on a glass substrate as the workpiece W, a coating apparatus for applying an organic material for forming a hole transport layer on a glass substrate (hole injection layer), and a coating apparatus for applying an organic material for forming a light emitting layer on a glass substrate (hole transport layer). Further, in the case in which the substrate processing system also forms an electron transport layer and an electron injection layer in addition to forming the hole injection layer, the hole transport layer, and the light emitting layer of the organic light emitting diode, the droplet ejecting apparatus 1 may also be applied to the coating process of forming the electron transport layer and the electron injection layer.

The droplet ejecting apparatus 1 may be applied to form an organic EL layer of an organic light emitting diode as described above, and may be applied to electro-optical devices (flat panel displays (FPD)) such as color filters, liquid crystal display devices, plasma displays (PDP devices), electron emitting devices (FED devices or SED devices), or may be applied to forming metal wiring, lenses, resist, light diffusion bodies, and the like.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A workpiece processing apparatus comprising:
   a workpiece table configured to receive a workpiece thereon;
   a plurality of carriage units, each carriage unit including a carriage plate, a carriage, and a droplet ejecting head arranged on a lower side of the carriage, each droplet ejecting head being configured to perform a predetermined processing on the workpiece placed on the workpiece table;
   a linear motor configured to move the workpiece table in a scanning direction relative to the droplet ejecting head;
   a linear scale configured to measure a position of the workpiece table in the scanning direction by outputting a pulse signal corresponding to a position of the linear motor;
   a pair of sub-scanning direction guide rails configured to move the plurality of carriage units in a sub-scanning direction orthogonal to the scanning direction;
   a detector including a camera mounted on each carriage plate, each camera being positioned adjacent each droplet ejecting head and positioned in a line with each droplet ejecting head along the scanning direction, the detector configured to detect a position of the workpiece placed on the workpiece table by detecting reference marks formed on the workpiece; and
   a controller configured to calculate a positional correction amount of the workpiece table based on the pulse signal and a detection result of the detector using a correction table, convert the pulse signal, and output a converted pulse signal to the linear motor and an inkjet controller configured to control a droplet ejection timing of each droplet ejecting head,
   wherein the detector detects the position of the workpiece before a first droplet ejecting head processes the workpiece, and
   the controller is further configured to renew the correction table used for the calculation of the positional correction amount of the workpiece table while the workpiece table is moved by the linear motor.

2. The workpiece processing apparatus of claim 1, wherein the predetermined processing is drawing a pattern by ejecting droplets of a functional liquid onto the workpiece.

3. A workpiece processing method comprising:
   providing a workpiece processing apparatus comprising:
      a plurality of carriage units, each carriage unit including a carriage plate, a carriage, and a droplet ejecting head arranged on a lower side of the carriage, each droplet ejecting head configured to perform a predetermined processing on a workpiece placed on a workpiece table, each carriage unit being mounted on a pair of sub-scanning direction guide rails configured to move the plurality of carriage units in a sub-scanning direction orthogonal to a scanning direction,
      a linear motor configured to move the workpiece table in the scanning direction relative to the droplet ejecting head,
      a linear scale configured to measure a position of the workpiece table in the scanning direction by outputting a pulse signal corresponding to a position of the linear motor;
      a detector including a camera mounted on each carriage plate, each camera being positioned adjacent each droplet ejecting head and positioned in a line with each droplet ejecting head along the scanning direction, the detector configured to detect a position of the workpiece placed on the workpiece table by detecting reference marks formed on the workpiece; and
      a controller configured to calculate a positional correction amount of the workpiece table based on the pulse signal and a detection result of the detector using a correction table, convert the pulse signal, and output a converted pulse signal to the linear motor and an inkjet controller configured to control a droplet ejection ejection timing of the each droplet ejecting head,
      wherein the detector detects the position of the workpiece before a first droplet ejecting head processes the workpiece, and
         the controller is further configured to renew the correction table used for the calculation of the positional correction amount of the workpiece table while the workpiece table is moved by the linear motor;
   measuring, with the linear scale, the position of the workpiece table while moving the workpiece table relative to the first droplet ejecting head by the linear motor in the scanning direction orthogonal to the sub-scanning direction by outputting the pulse signal corresponding to the position of the linear motor;
   detecting, with the detector including the camera mounted on each carriage plate, each camera being positioned adjacent each droplet ejecting head and positioned in the line with each droplet ejecting head along the scanning direction, the position of the workpiece placed on the workpiece table by detecting the reference marks formed on the workpiece while moving the workpiece table relative to the first droplet ejecting head by the linear motor in the scanning direction;

calculating the positional correction amount of the workpiece table based on the pulse signal and the detection result of the detector using the correction table, converting the pulse signal, and outputting the converted pulse signal to the linear motor and the inkjet controller configured to control the droplet ejection timing of the droplet ejecting head, and renewing the correction table used for the calculating of the positional correction amount of the workpiece table while the workpiece table is moved by the linear motor, wherein the detecting is performed before the first droplet ejecting head processes the workpiece.

4. The workpiece processing method of claim 3, wherein the predetermined processing is drawing a pattern by ejecting droplets of a functional liquid onto the workpiece.

5. The workpiece processing apparatus of claim 1, wherein the position of the workpiece detected by the detector includes a position in a Y-axis direction, a position in an X-axis direction, and a position in a $\theta$ direction.

* * * * *